US006954155B2

(12) United States Patent
Osa

(10) Patent No.: US 6,954,155 B2
(45) Date of Patent: Oct. 11, 2005

(54) DATA COMPRESSION METHOD AND PROCESSOR

(75) Inventor: Kinya Osa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/793,910

(22) Filed: Mar. 8, 2004

(65) Prior Publication Data

US 2004/0178932 A1 Sep. 16, 2004

(30) Foreign Application Priority Data

Mar. 10, 2003 (JP) ........................................ 2003-064038

(51) Int. Cl.⁷ .............................................. H03M 7/00
(52) U.S. Cl. .............................. 341/50; 51/60; 714/794
(58) Field of Search ............................ 341/50, 51, 60; 714/794; 375/240; 382/238

(56) References Cited

U.S. PATENT DOCUMENTS 4,878,221 A * 10/1989 Shimada ..................... 714/794
5,659,737 A * 8/1997 Matsuda ..................... 707/101
6,055,273 A * 4/2000 Isomura ..................... 375/240
6,215,558 B1    4/2001 Kubota ...................... 358/1.15
6,473,530 B2 * 10/2002 Nakayama .................. 382/238
2002/0027558 A1    3/2002 Osa ........................... 345/537

FOREIGN PATENT DOCUMENTS

JP          9-154021         6/1997      ............ H04N/1/41

* cited by examiner

Primary Examiner—Jean Bruner Jeanglaude
(74) Attorney, Agent, or Firm—Fitzpatrick, Cella, Harper & Scinto

(57) ABSTRACT

A data compression method for executing encode commands for PackBits compression by a processor. The encode commands include a first command to obtain an encode processing state of the PackBits compression and control output of a control code (+1, –2 etc.) based on the encode processing state, a second command to control output of input data (A to F) based on the encode processing state, and a third command to control output of a control command upon completion of the PackBits compression. In this arrangement, the PackBits encode processing can be performed at a high speed by the processor.

25 Claims, 11 Drawing Sheets

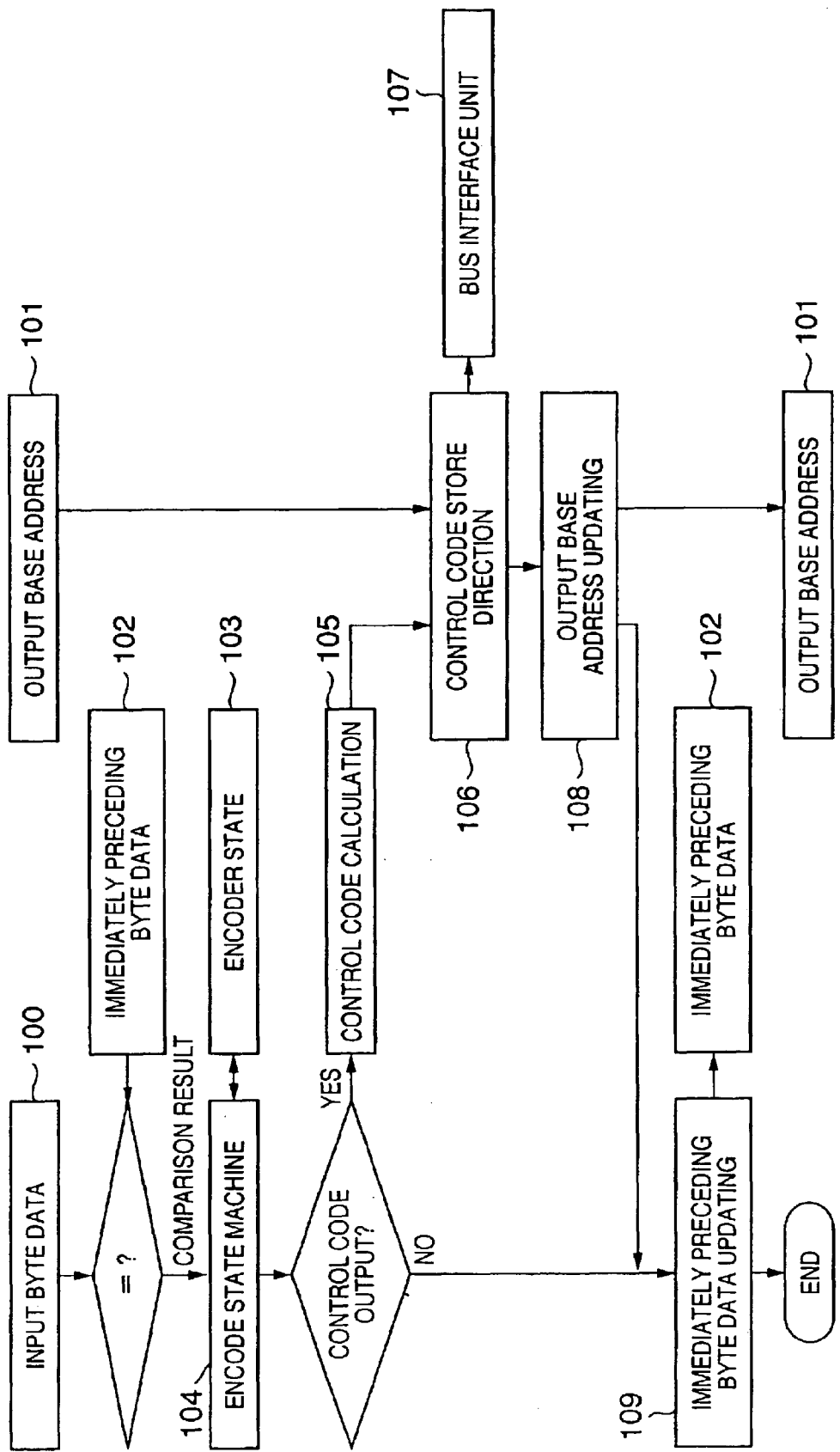

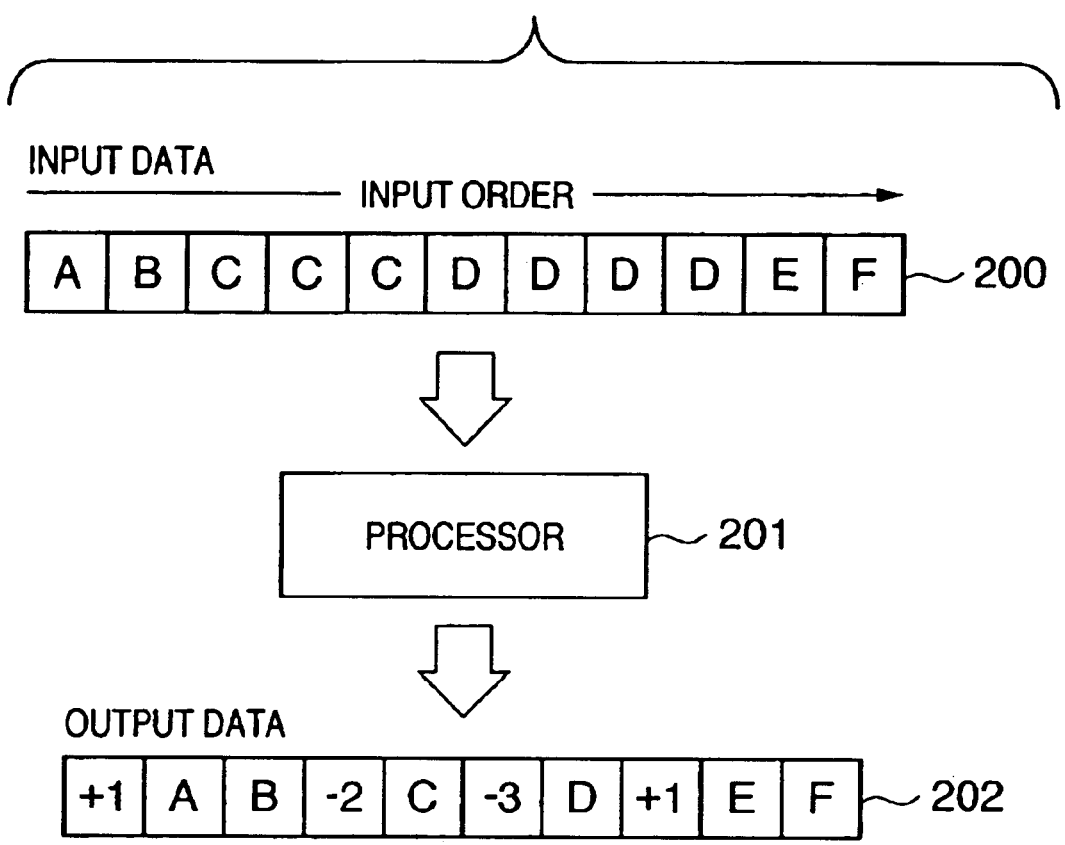

DATA COMPRESSION METHOD AND PROCESSOR

CLAIM OF PRIORITY

The present application claims priority under 35 U.S.C. §119 from Japanese Patent Application No. 2003-064038, entitled "A Data Compression Method and A Processor for Implementing Same" and filed on Mar. 10, 2003, the entire contents of which are hereby incorporated by reference herein.

FIELD OF THE INVENTION

The present invention relates to a data compression technique of run-length compressing image data, sound data or the like by a processor.

BACKGROUND OF THE INVENTION

Upon processing of image data, sound data or the like, to suppress the size of intermediate data and output data, data compression by a run-length method is often performed. A representative run-length compression is PackBits compression described in TIFF specification.

The PackBits compression or run-length compression has been conventionally processed by software of processor or by hardware. Such PackBits compression is disclosed in, e.g., Japanese Patent Application Laid-Open No. 9-154021 (counterpart U.S. Pat. No. 6,215,558).

However, in a case where PackBits compression encoding is made only by software, the processing speed is low. That is, as PackBits compression encode processing is accompanied by plural conditional determinations, high speed processing cannot be performed if processing is to be made with only basic processor computation commands. If specialized hardware for PackBits compression encoding is provided in addition to the processor for data processing to increase the processing speed, an overhead occurs in the processor to access external hardware. For example, it becomes difficult to change a process flow for compression in fine data units.

Further, in a case where data immediately preceding PackBits compression encoding is outputted in reverse order of that of data to be inputted into the PackBits compression encoder, the processing speed is lowered due to data rearrangement, and further, a temporary buffer must be prepared for rearrangement. Such situation occurs when lateral image inversion processing is performed immediately before PackBits compression or when image processing with directionality such as error diffusion is performed in reverse order of input data order.

SUMMARY OF THE INVENTION

The present invention has been proposed to solve the above-described problems, and is characterized in that, upon execution of PackBits compression encoding by a processor, high processing speed and flexibility of process flow can be attained without preparing specialized external hardware in addition to the processor.

According to the present invention, the foregoing object is attained by providing a data compression method for executing encode commands for PackBits compression by a processor, comprising the steps of: receiving input data; generating compressed data by executing an encode command group specialized for the PackBits compression including at least one command, based on a data string of the input data; and outputting the compressed data, wherein first processing to obtain an encode processing state of the PackBits compression and to control output of a control code based on the encode processing state, second processing to control whether or not output of the input data without any processing is to be performed, based on the encode processing state and third processing to control the output of the control code upon completion of the PackBits compression, are performed in accordance with the encode command group.

Further, According to the present invention, the foregoing object is attained by providing a processor which executes encode commands for PackBits compression, comprising: encode state holding means for holding an encode processing state of PackBits compression; encode state calculation means for calculating an encode processing state of the PackBits compression; and output address calculation means for calculating an address for encode data to be outputted.

Moreover, According to the present invention, the foregoing object is attained by providing a data compression method for processing PackBits compression by a software program installed in a processor, comprising: a data reception step of receiving an input data string; a compressed data generation step of generating compressed data by encoding the input data string by using processing corresponding to predetermined encode command group, in correspondence with the attribute of the input data string; and an output step of outputting the compressed data.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1A is an explanatory diagram of the contents of processing in accordance with a PBE1 command according to a first embodiment of the present invention;

FIG. 2 is an example of output from PackBits encode processing (forward direction) according to the first embodiment;

DETAILED DESCRIPTION OF THE PREFERRED EMBODIMENTS

Figure 1B:
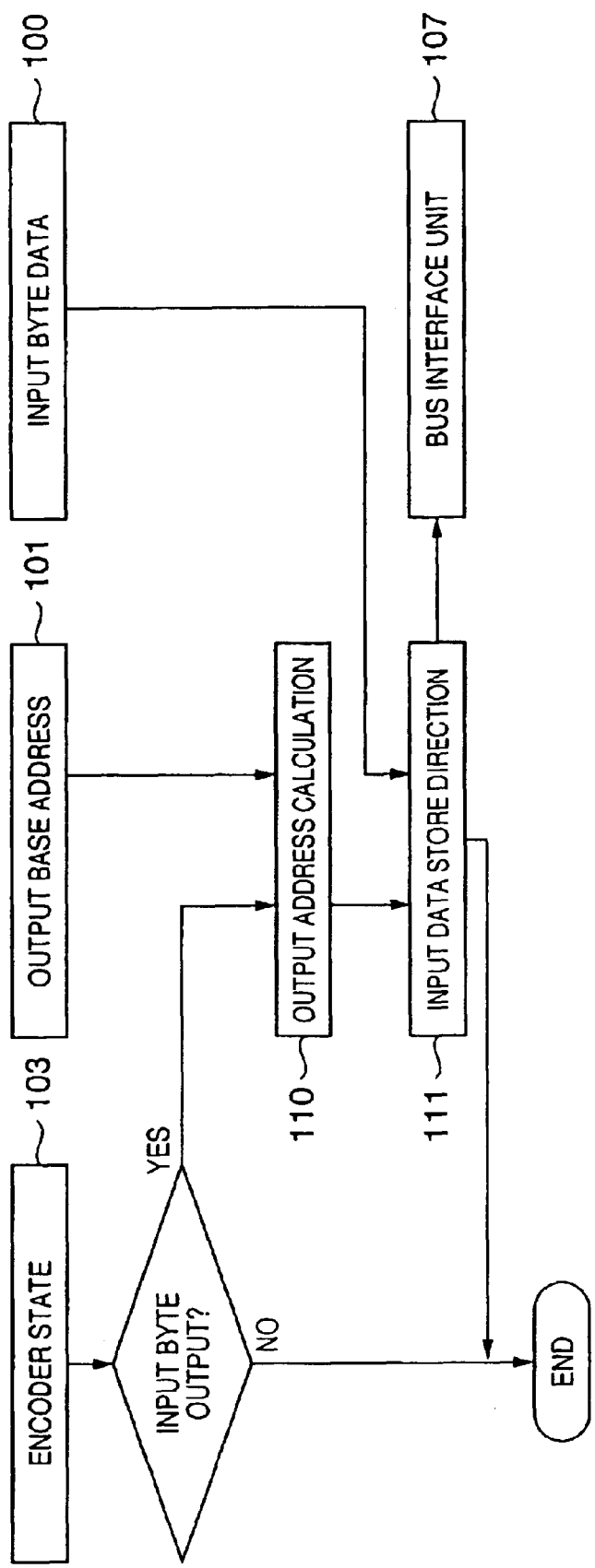
FIG. 1B is an explanatory diagram of the contents of processing in accordance with a PBE2 command according to the first embodiment.

The present invention provides a data compression method for executing encode commands for PackBits compression by a processor. The encode commands includes a first command to obtain an encode processing state of the PackBits compression and to control output of a control code based on the encode processing state, a second command to control whether or not output of said input data without any processing is to be performed, based on said encode processing state and a third command to control said output of the control code upon completion of the PackBits compression. In accordance with said first command, said processor obtains a new encode processing state based on the result of comparison between said input data and its immediately preceding data, and said encode processing state in said immediately preceding data, and determines possibility/impossibility of the output of control code based on said new encode processing state, and if the output is to be performed, said processor outputs said control code based on an output base address, and updates said output base address. Further, in accordance with said second command, said processor determines whether or not the output of said input data without any processing is to be performed, and if said output is to be performed, calculates an output address based on said encode processing state and said output base address. Further, in accordance with said third command, said processor outputs said control code based on said new encode processing state. Note that the present invention is not limited to the above first to third commands, but the correspondence between these commands and processings may be different. That is, the advantages of the present invention can be attained as long as the first to third commands can be executed with at least one command.

Further, according to another aspect of the present invention, provided is a data compression method for performing the PackBits compression by a software program installed in a processor. An input data string is received, and the input data string is encoded while appropriately using processing corresponding to predetermined encode commands (the above-described 3 commands), in correspondence with the attribute of the input data string (e.g., continuity of same data in the data string), thus compressed data is generated. In this arrangement, the processing speed can be greatly increased in comparison with the conventional PackBits compression by only software.

Note that said encode processing state is identified with a label of a value within a predetermined range, and corresponds to an initial state, a replicate run, and a literal run, in accordance with a label value. And that as said label value, −128 corresponds to the initial state, −1 to −127 corresponds to the replicate run, and 0 to 127 corresponds to the literal run.

If the same value has been continuously inputted twice as said input data, said processor continues processing as the literal run, and when said value has been continuously inputted thrice, said processor processes said input data as the replicate run, in accordance with said first command. Further, said processor continues processing for the literal run by disabling the output of said control code in accordance with said first command and enabling the output of said input data in accordance with said second command. Further, said processor continues processing for the replicate run by disabling the output of said control code in accordance with said first command and disabling the output of said input data in accordance with said second command.

Further, if the label value of said encode processing state is 127 and said input data is different from said immediately preceding data, said processor outputs a control code +127 in accordance with said first command, and outputs said input data to an address corresponding to the next run in accordance with said second command, thereby determines the literal run having said control code 127. Further, when the same value has been continuously inputted thrice as said input data, said processor outputs a control code in accordance with said first command but disables the output of data in accordance with said second command, thereby determines the literal run before the thrice-continuous same input data, and continues processing for the replicate run having a control code −2.

Further, if the same data has been inputted for 2 bytes after 127-byte literal run candidate data, said processor outputs a control code 126 in accordance with said first command, and outputs said input data without any processing to an address next to the next control code address in accordance with said second command, thereby determines the literal run having said control code +126, and continues processing for the replicate run having a control code −1 for the current input value. Further, if the same data has been continuously inputted for 128 bytes or more, said processor outputs a control code −127 in accordance with said first command, and outputs said input data without any processing to an address next to the next control code address in accordance with said second command, thereby determines the replicate run having said control code −127. Further, if data different from said immediately preceding data is inputted during processing for the replicate run, i.e., when the label=−1 to −127 holds, said processor outputs a label before transition as said control code in accordance with said first command, and outputs data to an address next to the next control code address in accordance with said second command, thereby determines the replicate run.

The processor calculates an output address for said control code when outputted in accordance with said first and third commands and said data to be outputted without any processing, based on said output base address and said encode processing state.

Further, the present invention provides a processor which executes encode commands for PackBits compression. The processor holds an encode processing state of PackBits compression, calculates an encode processing state of the PackBits compression, and calculates an address for encode data to be outputted. Note that the encode commands include a first command to obtain the encode processing state of the PackBits compression and control output of a control code based on the encode processing state, a second command to control as to whether or not input data is to be outputted without any processing based on said encode processing state, and a third command to control the output of the control code upon completion of the PackBits compression.

The held encode processing state includes immediately preceding data of input data, label information indicating the encode processing state, and an output base address. Further, the encode state calculation is determination of a new encode processing state and a command operation based on the input data and the held encode processing state. An address to which encode data is to be outputted is calculated based on the calculated new encode processing state.

The present invention as described above can be realized in correspondence with the following embodiments in the arrangement and processing as shown in the drawings attached to the specification.

Hereinbelow, an embodiment according to the present invention will be described. Note that in the present embodiment, a phrase "output control" at least means determination of output address or determination of possibility/impossibility of output.

<First Embodiment>

First, the PackBits compression method described in the TIFF specification as a representative run-length compression method as a base of the present embodiment will be described. Data format by PackBits compression comprises a repetition of 1-byte control code N and a byte data string of byte length determined by the control code N. The operations of decoder are classified into the following (1) to (3) in accordance with the value of control code N.

$$0 \leq N \leq 127 \quad (1)$$

An N+1 byte data string follows the control code, and upon decoding, the N+1 byte except the control code is outputted without any processing (in the TIFF specification, referred to as a "literal run").

$$-127 \leq N \leq -1 \quad (2)$$

A 1 byte data string follows the control code, and upon decoding, the 1 byte data after the control code is outputted repeatedly −N+1 times (in the TIFF specification, referred to as a "replicate run").

$$N = -128 \quad (3)$$

No byte data string follows the control code, and upon decoding, the control code is discarded.

Generally, the PackBits compression encoding may be any form of encoding as long as original data can be reproduced by the above-described decoder, however, as a basic policy to perform encoding at a high compression rate, encoding of the replicate run format (2) is preferably made on a repetition of same byte data as much as possible, and encoding of the literal run format (1) is performed on other types of byte data as much as possible. Note that regarding twice repetition of byte data, the compression rate may be lowered in some cases in encoding of the replicate run format (N=−1), it is necessary to select an encoding format in correspondence with input data.

Next, the PackBits compression encoding according to the present embodiment will be described in detail.

The PackBits compression encoding of the present embodiment is realized as a processor having 3 PackBits encode commands. First, the 3 PackBits encode commands will be described. As the names of the commands (PBE1, PBE2 and PBEF) in the present embodiment are tentative names given for the sake of explanation, they can be changed arbitrarily.

*PBE1 command: receiving input byte data, calculating a state transition of encode processing state machine, and storing a control code in an appropriate output address if output of control code is required.

*PBE2 command: storing input byte data in an appropriate output address without any processing based on the result of state transition calculated in accordance with the PBE1 command.

*PBEF command: upon completion of processing of all the input byte data, storing an unoutputted control code into an appropriate output address, and resetting the encode processing state machine.

Next, an example of PackBits encoding using these 3 commands will be described with reference to FIGS. 2 and 3.

In FIG. 2, reference numeral 200 denotes input data in byte units arrayed from left to right, in which alphabets A to F denote 1-byte data having respective different values. The input data 200 is sequentially inputted into a processor 201 from left to right, and PackBits-encoded to output data 202. In the output data 202, alphabets A to F denote input data values, and numerical values +1, −3 and the like respectively denote a control code N. In FIG. 2, the 11 byte input data is compressed and outputted as 10 byte data.

Figure 3:
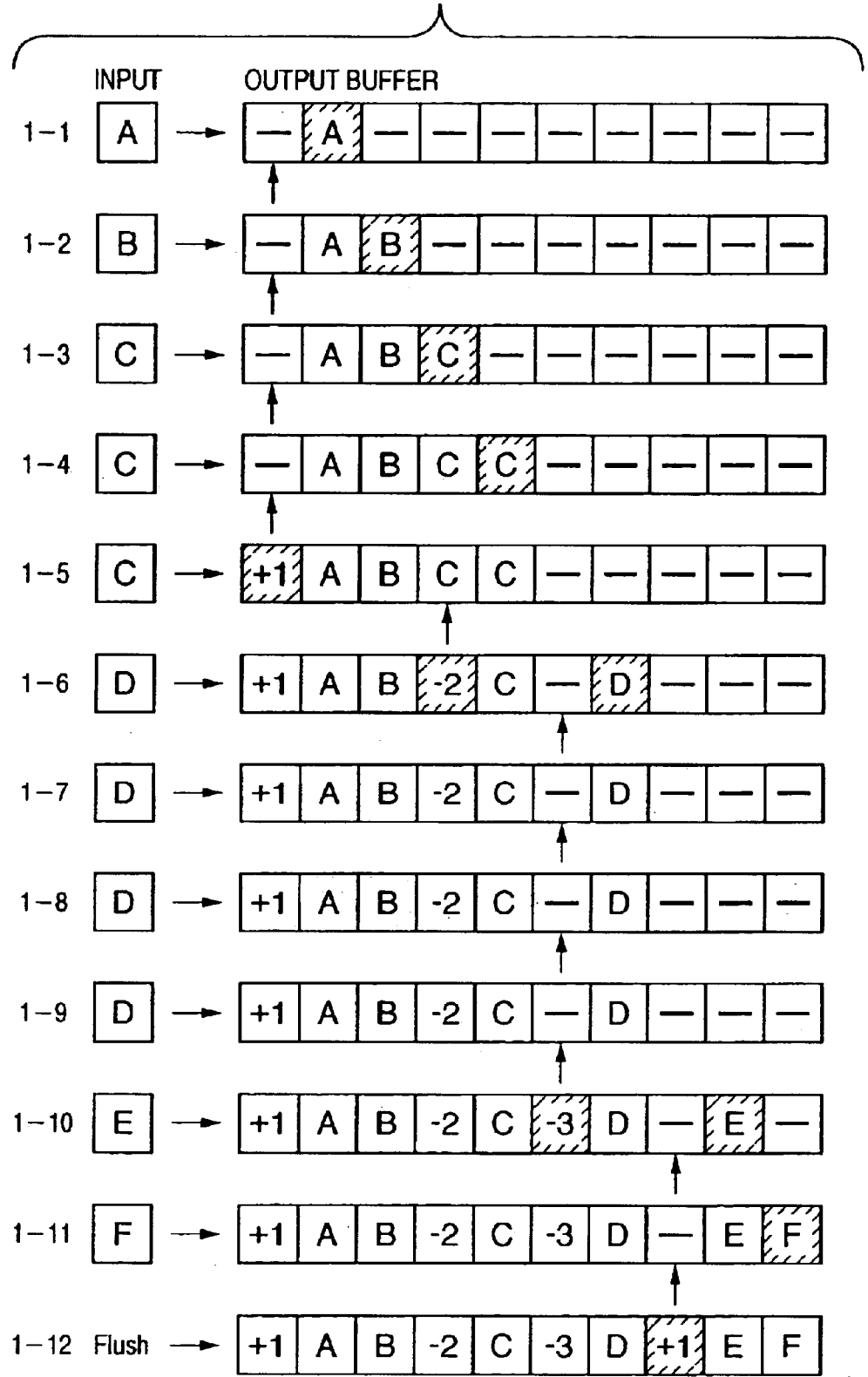
FIG. 3 is an example of processing at respective steps according to the first embodiment.

FIG. 3 shows an example of generation of output from each 1-byte data input in accordance with the commands of the present embodiment. In FIG. 3, numegrals S1-1 to S1-11 denote respective steps. In each step, the left side of rightward arrow denotes input data, while the right side, the state of output buffer after PBE1 command and the PBE2 command have been sequentially executed on the input. Note that in the output buffer state, "-" indicates an address where data has not been written yet. Further, the numerical values such as A to F, +1 and −2 respectively indicate a value written in the address. Particularly, hatched portions indicate values written in accordance with the PBE1 or PBE2 command executed at the step. Further, an upward arrow denotes an output base address to be described later.

Step S1-12 shows flush processing to output an unoutputted final control code after completion of input of all the data. At this step, the PBEF command is executed.

Next, the PackBits encoding according to the present embodiment will be described in detail in accordance with the respective steps in FIG. 3.

First, at step S1-1, initial data A is inputted. When there is only 1 byte data, it cannot be determined as a literal run or replicate run. Accordingly, no control code is outputted in accordance with the PBE1 command, and the input data is outputted without any processing in accordance with the PBE2 command. As input data at steps S1-2 and S1-3 are different from their immediately preceding data, they can be regarded as a literal run, and no control code is outputted in accordance with the PBE1 command, but the input data are outputted without any processing in accordance with the PBE2 command.

At step S1-4, as data C has been continuously inputted twice, it may be a replicate run. However, as described above, in the PackBits compression, the compression rate may be lowered by encoding a twice-continuous same data as a replicate run. At this step, determination is not performed, but processing the same as that at step S1-3 is performed.

At step S1-5, as data C has been continuously inputted thrice and replicate run encoding is determined, the previous 2 byte data A and B are made an N=+1 literal run. Accordingly, at step S1-5, +1 is outputted in accordance with the PBE1 command. Further, at this step, the input data C should be outputted, however, as the data C has been already written at the previous step, the data is not outputted at this step.

At step S1-6, as data D different from the data C has been inputted, it is determined that the data C is a thrice-continuous replicate run (N=−2). Then −2 is outputted in accordance with the PBE1 command. After the execution of the PBE1 command, there is only 1 byte as in the case of step S1-1, the input data D is outputted in accordance with the PBE2 command as in the case of step (1).

Next, at step S1-7, as the date D is continuously inputted twice, a similar state to that at step S1-4 occurs. However, at this step, as the immediately preceding data C is a replicate run and the compression rate is not lowered in encoding of twice-continuous same data as a replicate run adjacent to a replicate run, the continuous data D is determined as a replicate run. Accordingly, the output of input data in accordance with the PBE2 command is not performed. Further, at this time, as the run-length is unknown, the output of control code in accordance with the PBE1 command is not performed. Similarly, at steps S1-8 and S1-9, as the run-length is not determined, no control code is outputted.

At step S1-10, as data E different from the data D is inputted, it is determined that the run-length of the data D is 4. Then a control code N=−3 is outputted in accordance with the PBE1 command. As in the case of step S1-1, the input data is outputted in accordance with the PBE2 command.

At step S1-11, the output of control command in accordance with the PBE1 command is not performed as in the case of steps S1-1 and S1-2, but the input data is outputted in accordance with the PBE2 command.

Upon completion of step S1-11 at which all the data has been inputted, as a final control code is not outputted, the PBEF command is executed at additional step S1-12 and a final control code is outputted.

In this manner, according to the present embodiment, except appendant command required for data input or the like, the PBE1 command+PBE2 command is executed by the number of bytes of input data, and finally the PBEF command is executed once, thereby the PackBits encoding is completed. That is, since there is no condition determination or branching processing of software, the processing speed can be greatly improved in comparison with the conventional encoding processing only by software.

Figure 1C:
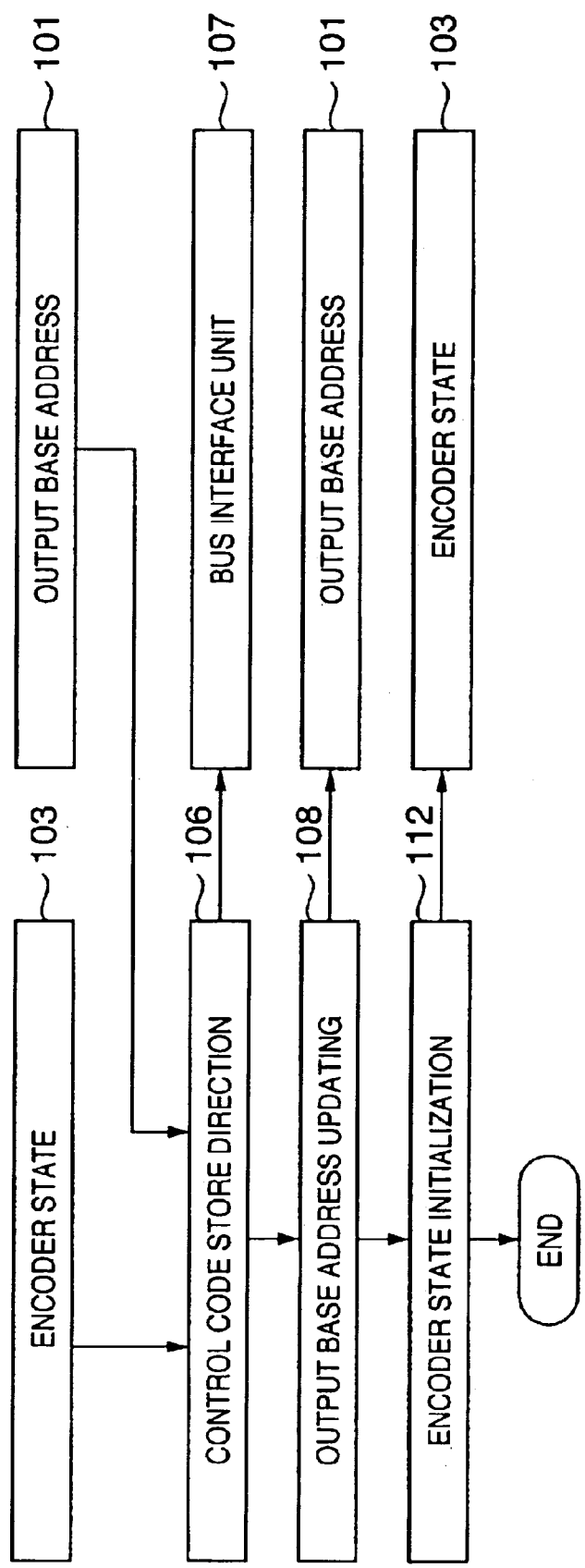
FIG. 1C is an explanatory diagram of the contents of processing in accordance with a PBEF command according to the first embodiment.

Next, particular contents of processing in accordance with the PBE1 command, the PBE2 command and the PBEF command according to the present embodiment will be described with reference to FIGS. 1A to 1C and FIG. 4. Note that in FIGS. 1A to 1C showing contents of processing in accordance with the respective commands, the same processing have the same reference numerals.

FIG. 1A is an explanatory diagram of the contents of processing in accordance with the PBE1 command.

When the PBE1 command is executed, input byte data 100 is compared with immediately preceding byte data 102 stored by a previous command, and the result of comparison (match or mismatch) is inputted into an encode state machine 104. The encode state machine 104 calculates an encoder state transition using the input comparison result and an encoder state 103, then holds a new encoder state, and outputs an instruction on whether or not to perform an operation of output of control code in accordance with the command. Note that the operation of the encode state machine 104 will be described later with reference to FIG. 4.

If the encode state machine 104 has not instructed to perform the output of control code in accordance with the command, immediately-preceding byte data updating 109 is performed, and the input byte data 100 upon execution of the command is stored as the immediately preceding byte data 102.

On the other hand, if the encode state machine 104 has instructed to perform the output of control code in accordance with the command, control code calculation 105 is performed, and control code store direction 106 is performed so as to store a control code in an output address indicated with an output base address 101. In the control code store direction 106, a bus interface unit 107 is directed to perform an actual memory writing operation. As an address to store a next control code is held as the output base address 101, output base address updating 108 is performed after the control code store direction 106, to store an address for storing a next control code as the output base address 101. Note that regardless of output of control code, the immediately-preceding byte data updating 109 is performed.

FIG. 1B is an explanatory diagram of the contents of processing in accordance with the PBE2 command.

When the PBE2 command is performed, a new encoder state 103 updated by the PBE1 command is read, and it is determined based on the state whether or not input byte data is to be outputted as is without any processing. The determination may be made based on the state of the state machine to be described later in FIG. 4 (e.g., input byte data is not outputted if the state is the −2~−127 state). However, as the necessity of output of input byte data can be determined upon execution of the PBE1 command, it may be arranged such that a flag of determination is forwarded as a part of encoder state to the PBE2 command.

If it is determined as a result of determination that input byte data is not to be outputted without any processing, as there is nothing to be done by the PBE2 command, the process ends. On the other hand, if it is necessary to output the input byte data without any processing, the output base address 101 updated by the PBE1 command in accordance with necessity is read, and output address calculation 110 is performed in correspondence with the encoder state 103. An input data store direction 111 directs the bus interface unit 107 to output the input byte data 100 by using the calculated address (the same value has been inputted as the immediately-preceding byte data 102 by the PBE1 command, the data 102 may be used instead of the input byte data 100).

FIG. 1C is an explanatory diagram of the contents of processing in accordance with the PBEF command.

When the PBEF command is performed, the encoder state 103 and the output base address 101 are read, a control code store direction 106 directs the bus interface unit 107 so as to store a control code for the output base address obtained from the encoder state. In an output base address updating 108, the next output base address after the control code store direction 106 is calculated and the address is stored as the output base address 101. As this address indicates the next data of the last output data upon completion of the PBEF command, the software executed in the processor is informed of the output base address after the execution of the PBEF command, thereby is informed of the number of bytes of the finally-outputted data.

Encode state initialization 112 is processing to write an initial value into the encoder state 103. As the initialization 112 is preparation for execution of the PBE1 command and the PBE2 command on the consequent new data after the execution of the PBEF command, it is not necessarily performed.

Figure 4:
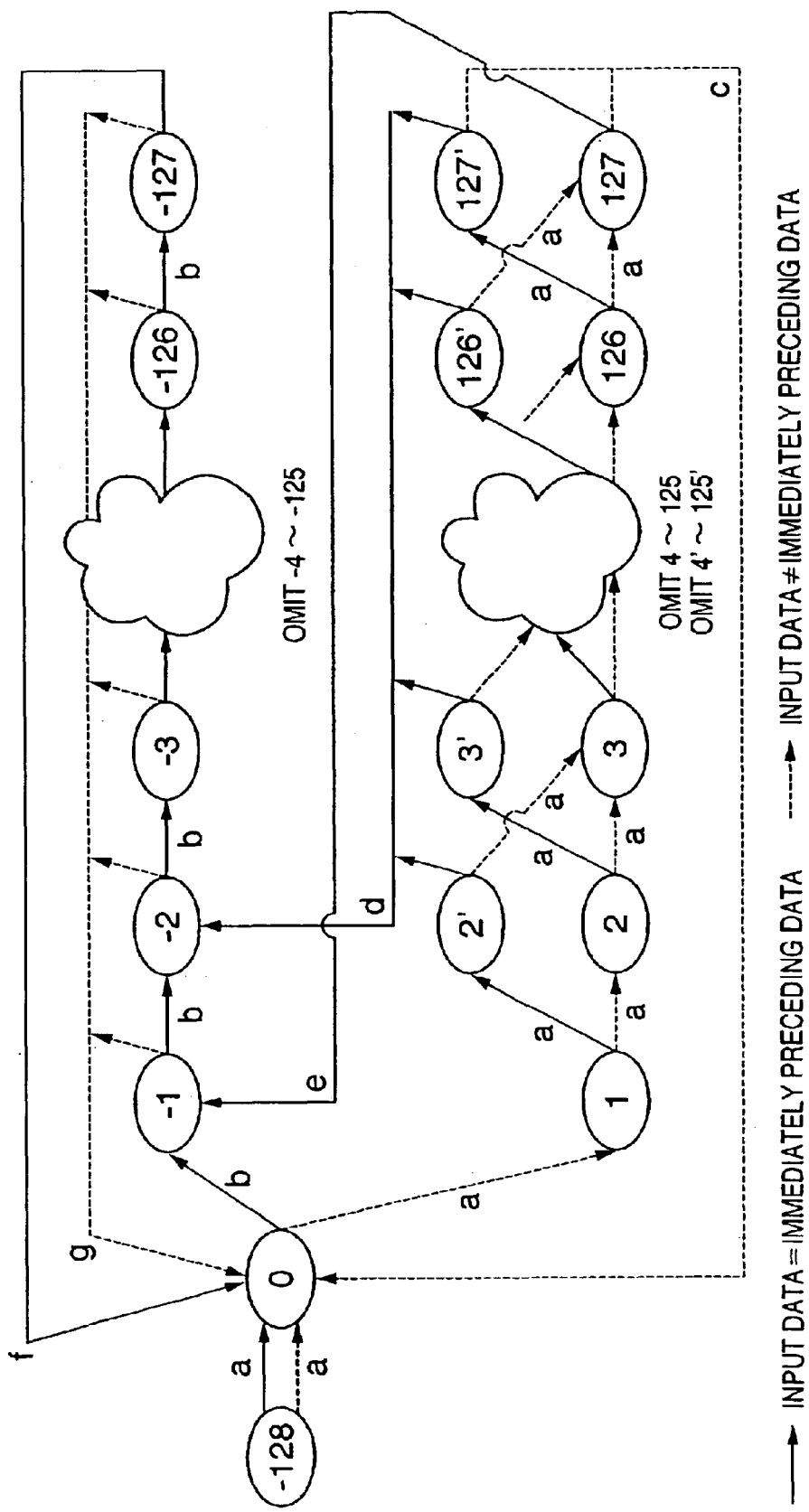
FIG. 4 is an example of state transition of an encode state machine to realize a command in the first embodiment.

FIG. 4 is an example of state transition of the encode state machine 104. As described above, the PackBits compression encoding has degree of freedom, and FIG. 4 shows an example of highly-efficient compression method. In FIG. 4, respective ellipses denote states of the encode state machine 104, and numerical values in the ellipses denote labels of the states. Further, arrows indicate state transition upon input. If input data and immediately preceding data are the same, the state is represented as a solid arrow; if the data are not the same, the state is represented as a dot-line arrow.

A label −128 indicates an initial state. From this state, upon each data input, the state of the encode state machine 104 changes. The label values of the respective states respectively indicate the value of the control code (N) for currently-compressed data. For example, when 2 byte data A and B have been inputted as in the case of step S1-2 in FIG. 3, the state changes as −128→0→1. At this time, it is assumed that the data can be encoded as an N=+1 literal run.

In FIG. 4, the state of the label −128 corresponds to the initial state; the state of a label −1 to −127, a replicate run; and the state of a label 0 to 127, a literal run. In the present embodiment, a state 2' to 127' is further provided. This state is provided for a particular processing for, if the same data has been continuously inputted twice, not processing the data as a replicate run unconditionally but processing the data as a literal run temporarily, then if the same data has been continuously inputted for a third time as the next input data, regarding the data as a replicate run. Accordingly, in a case where the same data as the immediately preceding data is inputted in the label 1 state, the state does not changes to the replicate run but processing temporarily made as the label 2' literal run, then if the same data has been continuously inputted for a third time as the next data, the state changes to the label −2 replicate run. On the other hand, if data different from the immediately preceding data is inputted in the label 2' state, as it is determined that the twice-continuous same data is processed as a literal run, the state returns to a label 3 normal literal run state.

In FIG. 4, alphabets a to g given to the respective arrows respectively indicate an operation to be performed in accordance with the PBE1 or PBE2 command upon occurrence of corresponding state transition. Next, particular contents of the operations will be described.

a Continuation of Literal Run:

It corresponds to steps S1-1 to S1-4 and S1-11 in FIG. 3; the output of control code in accordance with the PBE1 command is not performed, but only data output in accordance with the PBE2 command (to output input data without any processing) is performed.

b Continuation of Replicate Run:

It corresponds to step S1-7 to S1-9 in FIG. 3; the output of control code in accordance with the PBE1 command nor the data output in accordance with the PBE2 command is not performed.

c Determination of Literal Run (N=127):

although not shown in FIG. 3, as there is a limitation of 128 bytes as processible maximum length of literal run, if data different from its immediately preceding data has been inputted in the state 127 or 127', to determine an N=127 literal run, a control code +127 is outputted in accordance with the PBE1 command, and the state is changed to a state 0. In accordance with the PBE2 command, the input data is outputted (stored) as an address corresponding to the next run.

d Determination of Literal Run, and Continuation of Replicate Run (N=−2):

It corresponds to step S1-5 in FIG. 3; when the same data is continuously inputted thrice, the previous data is determined as a literal run, and a control code is outputted in accordance with the PBE1 command. At this time, as the same value as the input data has been already written in the previous state, it is not necessary to output the data in accordance with the PBE2 command.

e Determination of Literal Run (N=+126), and Continuation of Replicate Run (N=−1):

although not shown in FIG. 3, if 2 bytes of the same data are inputted after 127 byte literal run candidate data, the data are handled as a determined N=126 literal run and a continuing N=−1 replicate run. A control code 126 is outputted in accordance with the PBE1 command, and the input data is outputted (stored) into an address next to the next control code address in accordance with the PBE2 command.

f Determination of Replicate Run (N=−127):

although not shown in FIG. 3, as the maximum length of replicate run is 128, if the same data continues longer than 128 bytes, the data is determined as a N=−127 replicate run, and the state changes to a state 0. A control code −127 is outputted in accordance with the PBE1 command, and the input data is outputted (stored) in an address next to the next control code address in accordance with the PBE2 command.

g Determination of Replicate Run:

It corresponds to steps S1-6 and S1-10 in FIG. 3; the run length of the replicate run is determined, and the state changes to the state 0. A label prior to the transition is outputted as a control code in accordance with the PBE1 command, and the input data is outputted (stored) in an address next to the next control code address in accordance with the PBE2 command.

Next, the method for calculation of output address will be described in detail.

As to control code, since an address to store a control code next is held as an output base address, the control code is stored using the output base address. In a case where storage of control code is performed, an address to store the next control code is calculated from the stored control code (N) by the following expressions.

new output base address=old output base address+$N$+2 (if $N \geq 0$ holds)

new output base address=old output base address+2 (if $N<0$ holds).

Further, the output of input byte data is made by referring to an output base address and a state label L (in case of (') added label, a value except (')) and the output is made to the next address.

That is,

New data store address=output base address+$L$+1 (if $L \geq 0$ holds)

New data store address=output base address+1 (if $L=-1$ holds)

Note that if $L \leq -2$ holds, it is not necessary to output an input data store address.

Note that in the calculation of input data store address, if L=−1 holds, as there is no distinction between the transition from the state 0 to the state −1 (b) and the transition from the state 127 to the state −1 (e) as shown in FIG. 4, redundant storage occurs in the case of transition (b). However, the redundant store can be avoided by forwarding information for distinction between these transitions from the PBE1 command to the PBE2 command as a part of the encoder state 103.

As described above, according to the present embodiment, the PackBits compression encoding by software can be performed at a high speed merely by calling two commands (PBE1 and PBE2) for 1 byte data input.

Figure 5:
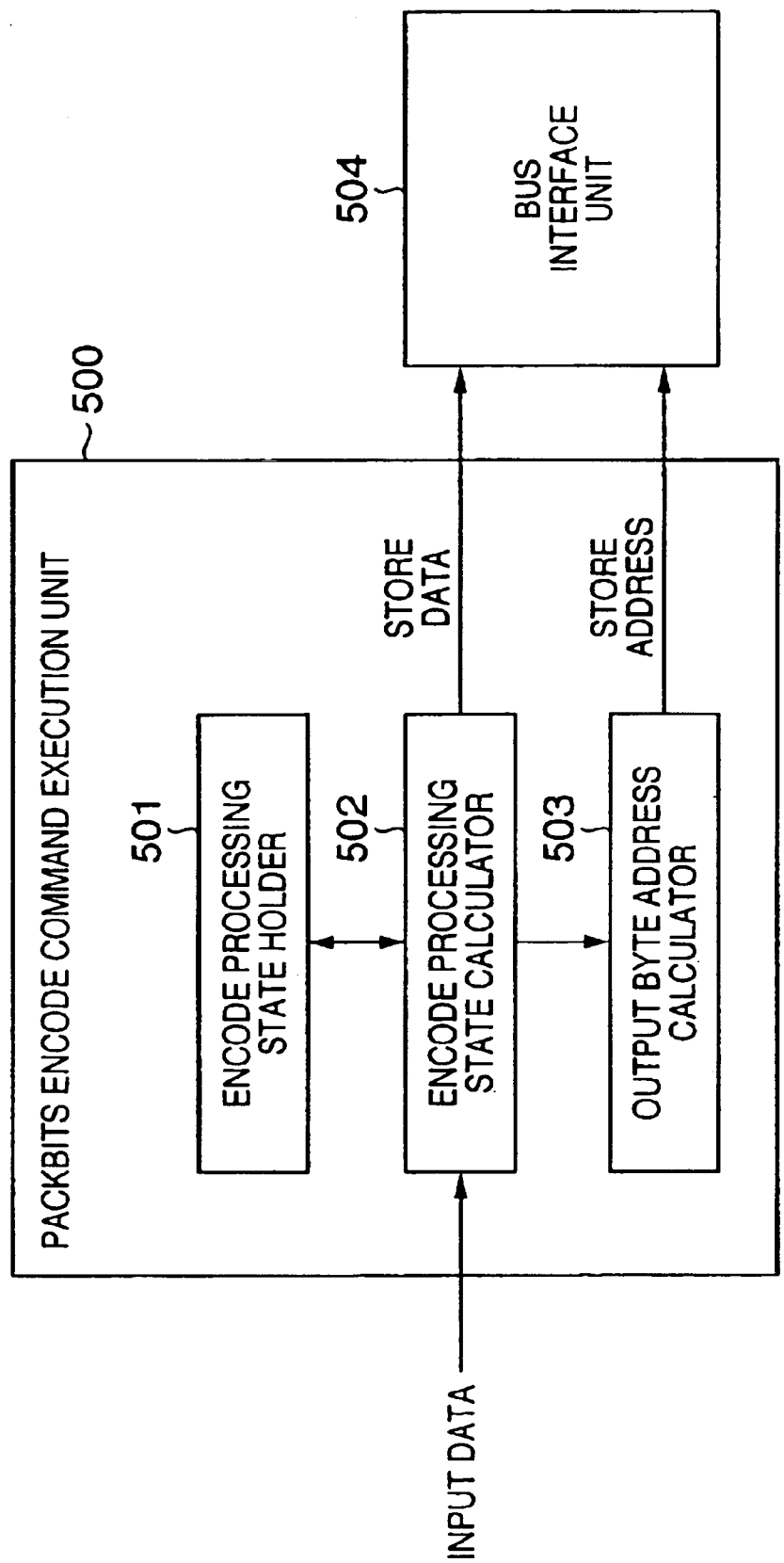
FIG. 5 is a block diagram showing a construction to realize the first embodiment.

FIG. 5 shows a particular construction to realize the PackBits encode commands. A PackBits encode command execution unit 500, which exists in the processor, takes charge of actual processing upon execution of PackBits encode command. Although not shown in FIG. 5, when a PackBits encode command is decoded by a decoder in the processor, the operation of the PackBits encode command execution unit 500 becomes effective. The PackBits encode command execution unit 500 has an encode processing state holder 501, an encode processing state calculator 502 and an output byte address calculator 503.

The encode processing state holder 501 holds state information to be held in accordance with the PackBits encode processing, e.g., the immediately preceding byte data 102, the encoder state 103 and the output base address 101 in FIG. 1A. Note that it is not necessary to store all these information into the encode processing state holder 501, but the processor may be arranged such that a part or all the information may be stored into a general-purpose register of another register of the processor and the information may be provided and utilized from the outside the PackBits encode command execution unit 500.

The encode processing state calculator 502 receives input data from the outside, and determines a state transition and an output operation in accordance with the command by using the state information stored in the encode processing state holder 501. The encode processing state calculator 502 determines the encode state machine 104 as shown in FIG. 1A and the flow of processing.

The output byte address calculator 503 calculates an address to which data is outputted, in accordance with the determination by the encode processing state calculator 502, and provides a store address to a bus interface unit 504 outside the PackBits encode command execution unit 500. At this time, the encode processing state calculator 502 provides store data to the bus interface unit 504.

Note that the commands are not necessarily implemented in the formats as shown in FIGS. 1A to 1C, FIG. 4 and FIG. 5 in the present embodiment, but may be implemented in other various ways as long as the same results can be obtained.

Further, in FIGS. 1A to 1C, the three PackBits encode commands have been described, however, assignments of processing are not necessarily as described in these figures, but may be different as long as the same contents of processing are performed. Further, the number of commands is not limited to three, but may be two or one as long as command implementation can be made.

Further, in the PBE1 and PBE2 commands as shown in FIGS. 1A and 1B, to avoid unnecessary output, it is determined whether or not storage is to be performed by conditional determination. However, since the algorithm, even including unnecessary output, has no problem unless the final output result is changed, it may be arranged such that the execution of storage is not determined. For example, the same data may be repeatedly outputted even in continuation of replicate run (state transition (b) in FIG. 4), otherwise, when the condition for storage is not satisfied, an instruction to perform storage in a dummy address which has no influence on compression processing.

Further, in FIG. 1A, there is no description as to which of the command input/output data, the input byte data 100, the output base address 101, the immediately preceding byte data 102 and the encoder state 103 can be designated as a command operand (e.g., a general-purpose register), and which of them is an implicit command operand (e.g., a state register specialized for PackBits command). Optimum implementation of command operand and implicit command operand depend on implementation costs of available processor resources and command implementation.

As described above, according to the present embodiment, a change of process flow such as change of compression data unit can be flexibly made, and the processing speed of PackBits encoding by a processor can be greatly improved, by adding and installing compression commands in the processor, without providing external hardware specialized for PackBits compression in addition to the processor.

[Second Embodiment]

Hereinbelow, a second embodiment of the present invention will be described.

In the construction as shown in FIG. 5 of the first embodiment, the encode processing state holder 501 holds state information regarding currently-being encoded data string, however, in the second embodiment, the state information can be held with regard to plural data strings. That is, plural encode processing state holders are provided, and the encode processing state calculator 402 selectively uses one of the encode processing state holders, thereby PackBits encode processing for plural input data strings can be performed in parallel.

For example, assuming that two byte data strings {A0, A1, A2, ...} and {B0, B1, B2, ...} are inputted, they are respectively PackBits encoded as follows.

In a case where as input data, the data string A0, A1, A2, ... is first inputted and then the data string B0, B1, B2, ... is inputted, the first input data string A0, A1, A2, ... is encoded in accordance with the PBE1 and PBE2 commands, then after the final data of this data string, PBEF command is executed, and then the data string B0, B1, B2 ... is encoded.

However, in a case where the two data strings, in a mixed order as A0, B0, A1, B1, A2, B2 ... are inputted, to perform encode processing on the data string A0, A1, A2, ... first, the data string B0, B1, B2, ... must be stored in a temporary buffer area. In such case, as the construction of the second embodiment has plural encode processing state holders, a state holder for A data string is selected upon input of A0, A1, A2, ... while a state holder for B data string is selected upon input of B0, B1, B2 ..., thereby encoding on the two data strings can be performed in parallel without preparing a temporary buffer.

In this manner, the processor of the second embodiment holds plural encode processing states obtained in accordance with the PBE1 command, and performs execution of the respective commands based on an encode processing state selected from the plural encode processing states, in parallel, for the plural encode states.

As described above, according to the second embodiment, as the high-speed PackBits encode processing by software can be performed for plural input data strings in parallel, the processing speed can be further increased.

[Third Embodiment]

Hereinbelow, a third embodiment according to the present invention will be described.

In the third embodiment, the processor can execute Pack-Bits encode commands at a high speed even in a case where input data is inputted in reverse order of primary input order, i.e., inputted from the end to the head, e.g., when lateral image inversion is performed immediately before PackBits compression or when image processing with directionality such as error diffusion is performed in a reversed direction to input data order. Note that the names of commands used in the present embodiment are the same as those of the above-described first embodiment.

Next, the PackBits encoding in the reverse order according to the present embodiment will be described with reference to FIGS. 6 and 7.

Figure 6:
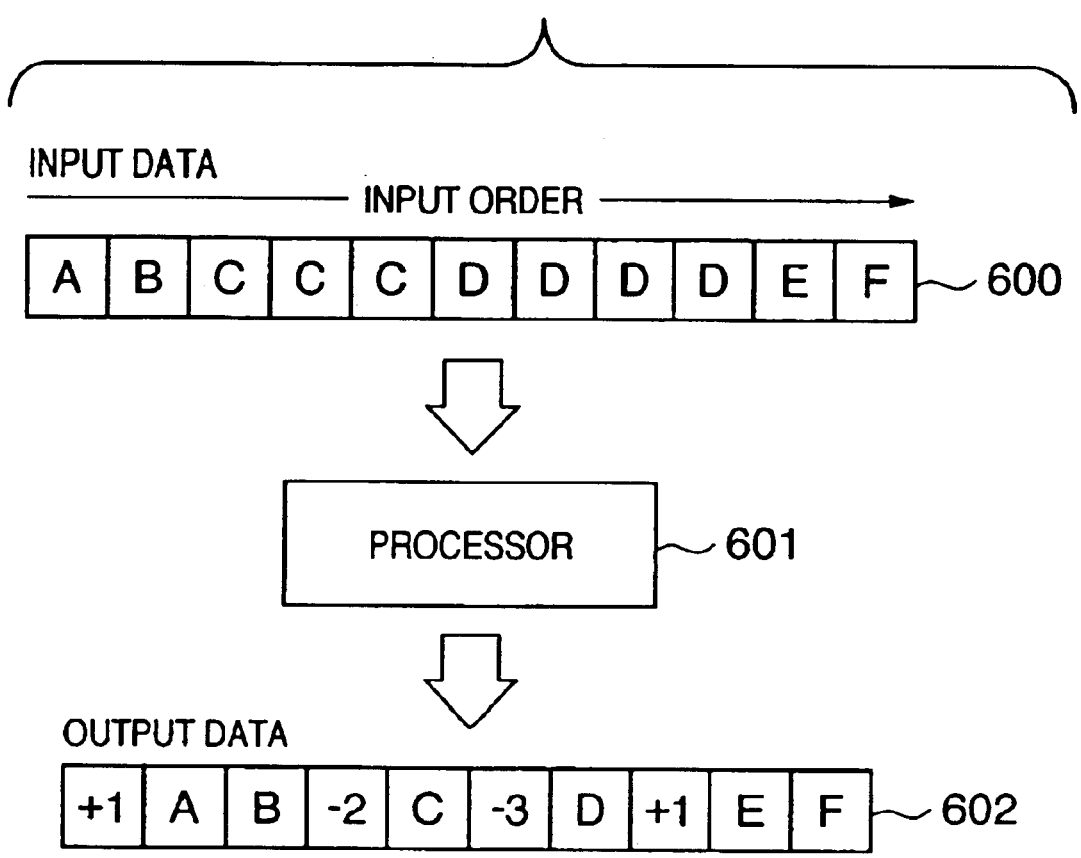
FIG. 6 is an example of output from PackBits encode processing (reverse direction) according to a third embodiment.

In FIG. 6, reference numeral 600 denotes input data in byte units arrayed from left to right. The order of the input data 600 is the same as that of the input data 200 as shown in FIG. 2 of the first embodiment, however, the order of input into the processor is different. In the input data 600 in FIG. 6, the data is inputted in reverse order of primary order, i.e., from right to left, as indicated with an arrow.

A processor 601 PackBits-encodes the reverse-input data 600, and outputs the data as output data 602. At this time, the output data 602 is in the same order as that of the output data 202 in FIG. 2. That is, the processor 601 generates output data in equivalent order to data inputted in primary order regardless of the reverse order input.

Next, the PackBits encoding according to the third embodiment will be described in detail with reference to the respective steps in FIG. 7. Note that symbols and the like in FIG. 7 are the same as those in FIG. 3 of the first embodiment, however, the output base address indicated with an upward arrow does not mean an address to which the next control code is outputted as described in the first embodiment, but means an address to which a last control code has been outputted.

Figure 7:
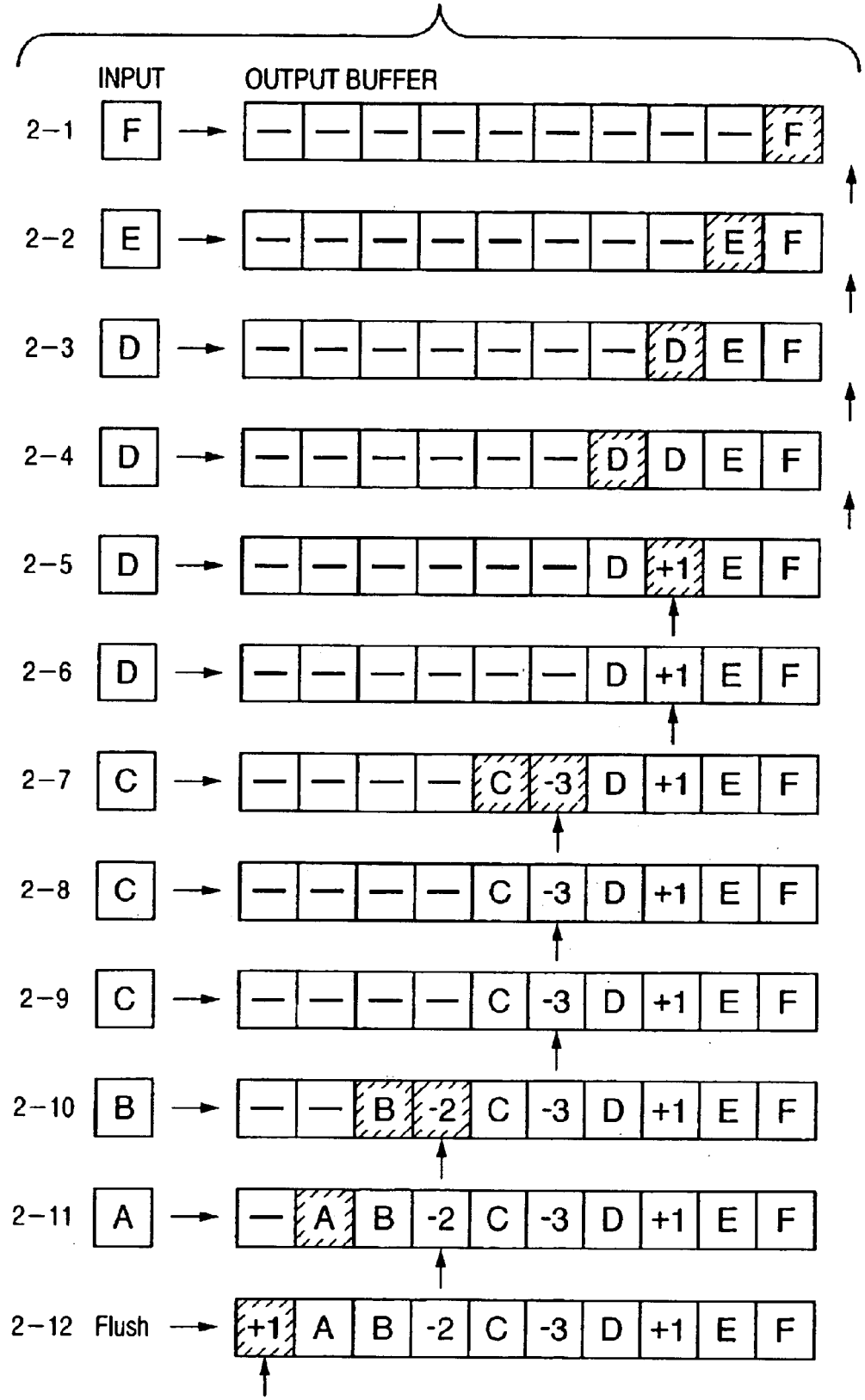
FIG. 7 is an example of processing at respective steps according to the third embodiment of the present invention.

The commands executed at the respective steps of FIG. 7 are the same as those in the case of FIG. 3. At steps S2-1 to S2-11, processing corresponding to the PBE1 command and the PBE2 command is performed in correspondence with the input data, and at step S2-12 after the input of final data, processing corresponding to the PBEF command is performed. Accordingly, in the third embodiment, the processing speed can be improved as in the case of the first embodiment.

The respective steps of FIG. 7 will be more particularly described. First, at step S2-1, initial data F is inputted, however, as the run type nor run length cannot be determined at this point where there is only 1 byte data, the output of control code in accordance with the PBE1 command is not performed but the input data is outputted without any processing in accordance with the PBE2 command. At this time, at step S2-1, as any control code has not been outputted yet, the output base address to indicate an address to which a last control code has been outputted indicates an address next to the end of the output buffer. Different from the first embodiment, an address to which a next control code is outputted is determined after the determination of run type and run length.

As the input data at steps S2-2 and S2-3 is different from the immediately preceding data, the data is regarded as a literal run, and the input data is outputted in accordance with the PBE2 command. At step S2-4, data D has been continuously inputted twice. As described in the first embodiment, in the PackBits compression, if the twice-continuous same data is encoded as a replicate run, the compression rate may be lowered. Accordingly, determination is not performed at this step.

At step S2-5, the data D has been continuously inputted thrice, and encoding as replicate run is determined. Then the 2 byte data E and F become an N=+1 literal run. Accordingly, at step S2-5, +1 is outputted in accordance with the PBE1 command. Further, in the PBE2 command, the input data D is to be outputted, however, as the data D has been already written at the previous step, data output is not performed at this step.

At step S2-6, further data D is inputted. As the run length is not determined, any output is not performed. Next, at step S2-7, as data C different from the data D is inputted, it is determined that the data D is four-times continuous replicate run (N=−3), and −3 is outputted in accordance with the PBE1 command. After the execution of PBE1 command, as there is 1 byte data as in the case of step S2-1, the input data C is outputted in accordance with the PBE2 command as in the case of step S2-1.

At step S2-8, as the data C has been continuously inputted twice, a similar situation to step S2-4 occurs, however, as the immediately preceding data D is a replicate run and the compression rate is not lowered in twice repetition of same data as a replicate run, adjacent to a replicate run, the data C is determined as a replicate run, and the data output in accordance with the PBE2 command (outputting input data without any processing) is not performed. Further, at this point, as the run length is not unknown, the output of control code in accordance with the PBE1 command is not performed.

At step S2-9, as the run length is not determined, anything is not outputted as in the case of step S2-6.

At step S2-10, as data B different from the data C is inputted, it is determined that the run length of the data C is 3, and a control code N=−2 is outputted in accordance with the PBE1 command. As in the case of step S2-1, the input data is outputted as is without any processing in accordance with the PBE2 command.

At step S2-11, as in the case of steps S2-1 and S2-2, the output of control code in accordance with the PBE1 command is not performed, but the data output in accordance with the PBE2 command is performed.

Upon completion of step S2-11 at which final data has been inputted, as a final control code is not outputted, the PBEF command is executed at additional step S2-12, and a final control code +1 is outputted.

In the above-described example of FIG. 7, as many steps are the same as those in the example of FIG. 3 of the first embodiment, however, the calculation of output address in FIG. 7 is different from that in FIG. 3. That is, the third embodiment can be realized by using almost the same flow of command processing in FIGS. 1A to 1C of the first embodiment and the same state machine as that shown in FIG. 4, and only changing the calculation of output address.

Figure 8A:
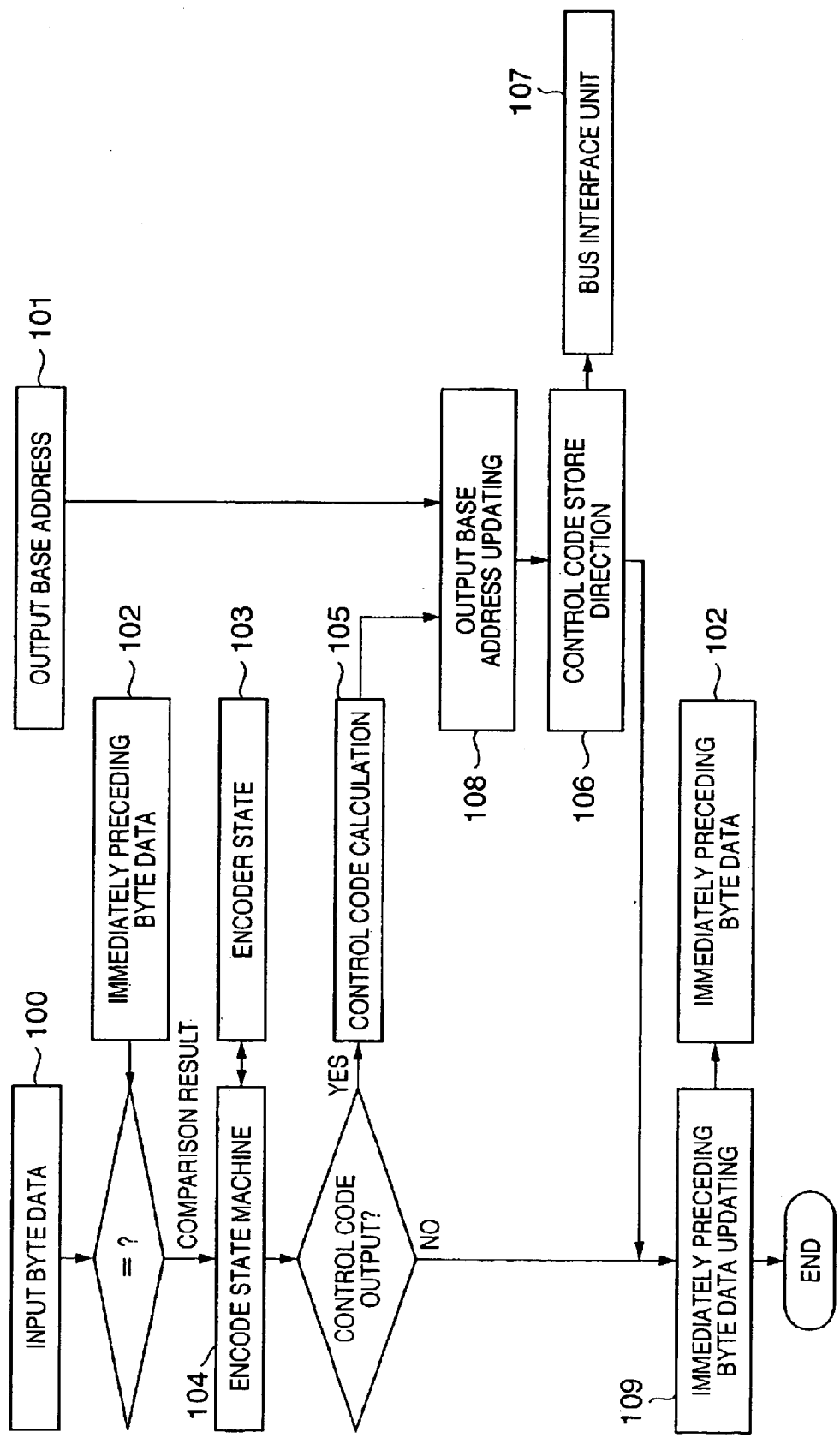
FIG. 8A is an explanatory diagram of the contents of processing in accordance with the PBE1 command according to the third embodiment of the present invention.
Figure 8B:
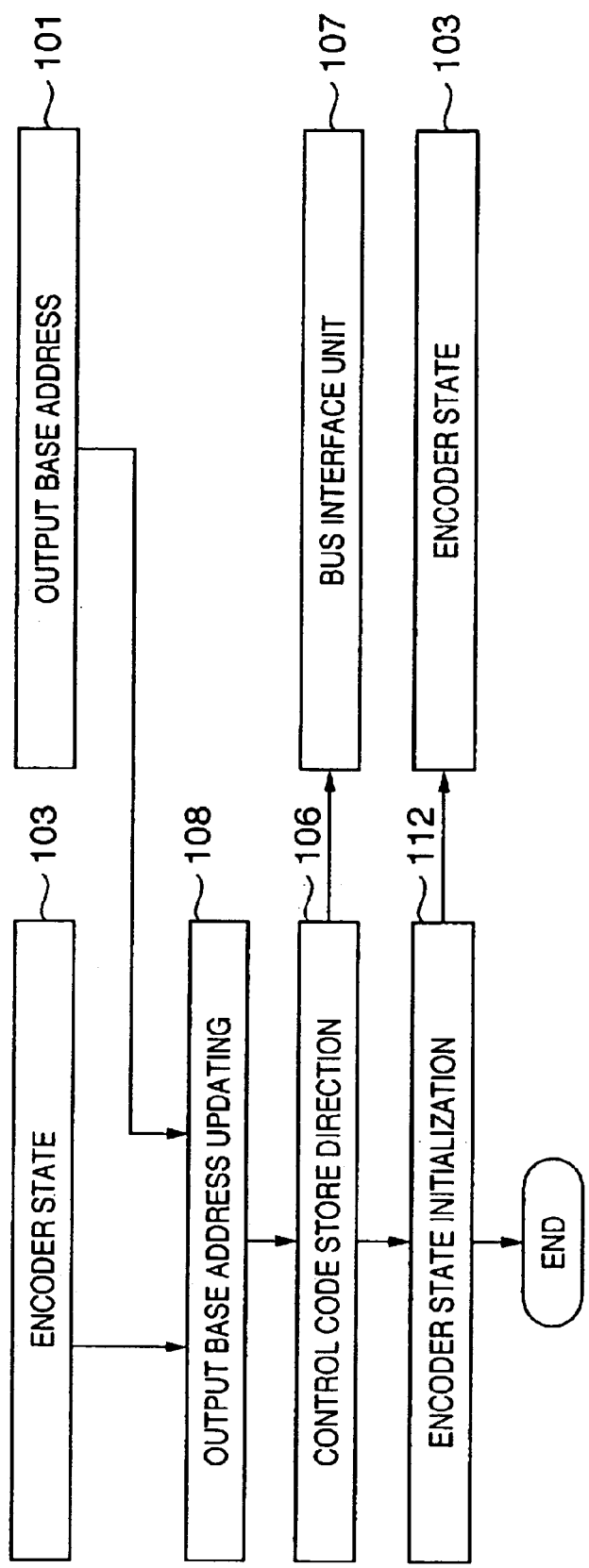
FIG. 8B is an explanatory diagram of the contents of processing in accordance with the PBE2 command according to the third embodiment.

FIGS. 8A and 8B respectively show the flow of PBE1 and PBEF command processing according to the third embodiment. Since the process flows are almost the same as those in FIGS. 1A and 1B, only the difference will be described here. Note that the processing in accordance with the PBE2 command is the same as that in FIG. 1B, the explanation thereof will be omitted.

First, the difference between FIG. 1A and FIG. 8A regarding the PBE1 command is the process order of the control code store direction 106 and the output base address updating 108. In the third embodiment, the output base address indicates an "address to which a last control code has been outputted". To output a control code, the output base address updating 108 is first performed so as to indicate an address to which a next control code is outputted, and then the control code store direction 106 is performed.

Also regarding the PBEF command, as the meaning of the output base address is different, the difference between FIG. 1C and FIG. 8B is that the order of the control code store direction 106 and the output base address updating 108.

Next, the calculation of output address according to the third embodiment will be described.

First, as to a control code, as an address in which a last control code has been stored is stored as an output base address, the output base address is updated and then stored. Upon updating of control code, a new address is calculated from a control code (N) to be stored by the following expressions:

new output base address=old output base address−(N+2) (if N≧0 holds)

new output base address=old output base address−2 (if N<0 holds)

Further, the output of input byte data is made to the following address by using the output base address and a state label L (if label with ('), a value except (')):

input data store address=output base address−(L+1) (if L≧0 holds)

input data store address=output base address−1 (if L=−1 holds)

Note that if L≧−2 holds, the output of input data store address is unnecessary.

If a comparison is made between these calculation expressions and the address calculation expressions in the first embodiment, it is understood that the difference is addition/subtraction of offset value to/from output base address.

Note that in the calculation of input data store address according to the third embodiment, regarding the case of L=−1, as there is no distinction between transition from state 0 to state −1 (b) and a transition from state 127 to state −1 (e) as shown in FIG. 4, redundant storage occurs in the case of transition (b). However, the redundant storage can be avoided by forwarding information for distinction between these transitions from the PBE1 command to the PBE2 command as a part of the encoder state 103.

In this manner, even in a case where input data is inputted in reverse order, the processor according to the third embodiment outputs a data string similar to that of the case where the input data is inputted in primary order. That is, the addition/subtraction of offset value in calculation of output base address is reversed to that of the case where the input data is inputted in primary order.

In this manner, according to the third embodiment, even in a case where input data is inputted in reverse order, from the end to the head, the PackBits compression encoding by software can be performed at a high speed merely by calling the two commands (PBE1 and PBE2) for 1 byte data input, as in the case of the first embodiment. Accordingly, as processing to rearrange the input data in reverse order is unnecessary, the degradation of processing speed can be prevented, and a temporary buffer for data storage is unnecessary.

Note that as the first and third embodiments can be implemented with almost the same construction except the address calculation, PackBits encode commands that selectively implements the first embodiment or the third embodiment can be readily realized by providing a selection unit for the case where input data is inputted in primary order and for the case where the input data is inputted in reverse order. That is, the address calculation method is changed in accordance with whether the input data is inputted in primary order or reverse order.

Further, in the compression method by the above-described conventional technique (Japanese Patent Application Laid-Open No. 9-154021), the order of PackBits compression control code and following byte data string is reversed. This method is similar to the case where the input data is compressed in reverse order in the third embodiment. Note that as the conventional compression method and the third embodiment are different in the calculation direction of output address, the conventional compression method generates an output incompatible with the PackBits compression. On the other hand, the compression of the third embodiment generates an output compatible with the PackBits compression.

[Other Embodiment]

The present invention can be applied to a system constituted by a plurality of devices (e.g., a host computer, an interface, a reader and a printer) or to an apparatus comprising a single device (e.g., a copy machine or a facsimile apparatus).

As described above, according to the present invention, upon execution of PackBits compression encoding by a processor, high speed processing and flexibility of process flow can be attained without providing specialized external hardware in addition to the processor.

The present invention is not limited to the above embodiments and various changes and modifications can be made within the spirit and scope of the present invention. Therefore, to appraise the public of the scope of the present invention, the following claims are made.

What is claimed is:

1. A data compression method for executing encode commands for PackBits compression by a processor, comprising the steps of:

receiving input data;

generating compressed data by executing an encode command group specialized for the PackBits compression including at least one command, based on a data string of the input data; and outputting the compressed data, wherein, first processing to obtain an encode processing state of the PackBits compression and to control output of a control code based on the encode processing state, second processing to control whether or not output of the input data without any processing is to be performed, based on the encode processing state, and third processing to control the output of the control code upon completion of the PackBits compression, are performed in accordance with the encode command group.

2. The data compression method according to claim 1, wherein the encode command group includes:

a first command to obtain an encode processing state of the PackBits compression and control output of a control code based on the encode processing state;

a second command to control whether or not output of the input data without any processing is to be performed, based on the encode processing state; and a third command to control the output of the control code upon completion of the PackBits compression.

3. The data compression method according to claim 2, wherein, in accordance with the first command, said processor obtains a new encode processing state based on a result of comparison between the input data and its immediately preceding data, and the encode processing state in the immediately preceding data, and determines possibility/impossibility of the output of control code based on the new encode processing state, and wherein if the output is to be performed, said processor outputs the control code based on an output base address, and updates the output base address.

4. The data compression method according to claim 3, wherein, in accordance with the second command, said processor determines whether or not the output of the input data without any processing is to be performed, and if the output is to be performed, calculates an output address based on the encode processing state and the output base address.

5. The data compression method according to claim 3, wherein, in accordance with the third command, said processor outputs the control code based on the new encode processing state.

6. The data compression method according to claim 2, wherein the encode processing state is identified with a label of a value within a predetermined range, and corresponds to an initial state, a replicate run and a literal run, in accordance with a label value.

7. The data compression method according to claim 6, wherein as label value −128 corresponds to the initial state, −1 to −127 corresponds to the replicate run, and 0 to 127 corresponds to the literal run.

8. The data compression method according to claim 7, wherein, if the same value has been continuously inputted twice as the input data, said processor continues processing as the literal run, and when the value has been continuously inputted thrice, said processor processes the input data as the replicate run, in accordance with the first command.

9. The data compression method according to claim 6, wherein said processor continues processing for the literal run by disabling the output of the control code in accordance with the first command and enabling the output of the input data in accordance with the second command.

10. The data compression method according to claim 6, wherein said processor continues processing for the replicate run by disabling the output of the control code in accordance with the first command and disabling the output of the input data in accordance with the second command.

11. The data compression method according to claim 7, wherein if the label value of the encode processing state is 127 and the input data is different from the immediately preceding data, said processor outputs a control code +127 in accordance with the first command, and outputs the input data to an address corresponding to the next run in accordance with the second command, and thereby determines the literal run having the control code 127.

12. The data compression method according to claim 7, wherein when the same value has been continuously inputted thrice as the input data, said processor outputs the control code in accordance with the first command but disables the output of data in accordance with the second command, and thereby determines the literal run, and continues processing for the replicate run having a control code −2.

13. The data compression method according to claim 7, wherein if the same data has been inputted for 2 bytes after 127-byte literal run candidate data, said processor outputs a control code 126 in accordance with the first command, and outputs the input data without any processing to an address next to the next control code address in accordance with the second command, and thereby determines the literal run having the control code +126, and continues processing for the replicate run having a control code −1.

14. The data compression method according to claim 7, wherein if the same data has been continuously inputted for 128 bytes or more, said processor outputs a control code −127 in accordance with the first command, and outputs the input data without any processing to an address next to the next control code address in accordance with the second command, and thereby determines the replicate run having the control code −127.

15. The data compression method according to claim 7, wherein if data different from the immediately preceding data is inputted during processing for the replicate run, said processor outputs a label before transition as the control code in accordance with the first command, and outputs data to an address next to the next control code address in accordance with the second command, to determine the replicate run.

16. The data compression method according to claim 3, wherein said processor calculates an output address for the control code outputted in accordance with the first and third commands and the data to be outputted without any processing, based on the output base address and the encode processing state.

17. The data compression method according to claim 1, wherein said processor holds plural encode processing states obtained by the first processing, and performs execution of the first to third processings based on an encode processing state selected from the plural encode processing states in parallel for plural encode states.

18. The data compression method according to claim 1, wherein even if the input data has been inputted in reverse order, said processor outputs a data string similar to that in a case where the input data is inputted in primary order.

19. The data compression method according to claim 18, wherein in the case where the input data has been inputted in reverse order, said processor controls addition/subtraction of an offset value in address calculation for the output base address in reverse manner to that in the case where the input data has been inputted in primary order.

20. The data compression method according to claim 19, wherein said processor changes the method of the address calculation based on whether the input data has been inputted in primary order or in reverse order.

21. A processor which executes encode commands for PackBits compression, comprising:

encode state holding means for holding an encode processing state of PackBits compression;

encode state calculation means for calculating an encode processing state of the PackBits compression; and output address calculation means for calculating an address for encode data to be outputted, wherein the encode commands include:

a first command to obtain the encode processing state of the PackBits compression and to control output of a control code based on the encode processing state;

a second command to control whether or not input data is to be outputted without any processing based on the encode processing state; and a third command to control the output of the control code upon completion of the PackBits compression.

22. The processor according to claim 21, wherein said output address calculation means calculates an address to which encode data is to be outputted, based on the new encode processing state calculated by said encode state calculation means.

23. The processor according to claim 21, wherein said encode state holding means holds immediately preceding data of input data, label information indicating the encode processing state and an output base address.

24. The processor according to claim 21, wherein said encode state calculation means determines a new encode processing state and a command operation based on the input data and the encode processing state held by said encode state holding means.

25. A data compression method for processing PackBits compression by a software program installed in a processor, comprising:

a data reception step, of receiving an input data string;

a compressed data generation step, of generating compressed data by encoding the input data string by using processing corresponding to a predetermined encode command group, in correspondence with an attribute of the input data string; and an output step, of outputting the compressed data, wherein the encode command group includes:

a first command to obtain the encode processing state of the PackBits compression and control output of a control code based on the encode processing state;

a second command to control whether or not input data is to be outputted without any processing based on the encode processing state; and a third command to control the output of the control code upon completion of the PackBits compression.

* * * * *